(12) United States Patent
Jeloka et al.

(10) Patent No.: US 11,682,432 B2
(45) Date of Patent: Jun. 20, 2023

(54) MULTI-TIER MEMORY ARCHITECTURE

(71) Applicant: Arm Limited, Cambridge (GB)

(72) Inventors: Supreet Jeloka, Austin, TX (US); Saurabh Pijuskumar Sinha, Schertz, TX (US); Shidhartha Das, Upper Cambourne (GB); Mudit Bhargava, Austin, TX (US); Rahul Mathur, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/343,829

(22) Filed: Jun. 10, 2021

(65) Prior Publication Data

US 2022/0199125 A1 Jun. 23, 2022

Related U.S. Application Data

(60) Provisional application No. 63/127,586, filed on Dec. 18, 2020.

(51) Int. Cl.
*G11C 5/14* (2006.01)
*G11C 5/02* (2006.01)

(52) U.S. Cl.
CPC ............... *G11C 5/147* (2013.01); *G11C 5/02* (2013.01)

(58) Field of Classification Search
CPC ................................ G11C 5/147; G11C 5/02
USPC ........................................................ 365/226
See application file for complete search history.

(56) References Cited

U.S. PATENT DOCUMENTS

2019/0295653 A1* 9/2019 Yip ...................... G11C 16/08

FOREIGN PATENT DOCUMENTS

CN 101065808 A * 10/2007

* cited by examiner

*Primary Examiner* — Huan Hoang
(74) *Attorney, Agent, or Firm* — Pramudji Law Group PLLC; Ari Pramudji

(57) ABSTRACT

Various implementations described herein are related to a device having voltage regulation architecture with multiple layers arranged in a multi-layer structure. The device may include one or more layers of the multiple layers with voltage regulation circuitry that may be configured to manage at least one of process variation and temperature variation between the multiple layers of the multi-layer structure.

20 Claims, 7 Drawing Sheets

600

610 — provide a first tier having first memory circuitry with a first signal path and a second signal path that replicates the first signal path

620 — provide a second tier having second memory circuitry with a third signal path and a fourth signal path that replicates the third signal path

630 — couple the first signal path to the third signal path so as to provide a first continuous signal path between the first tier and the second tier

640 — couple the second signal path to the fourth signal path so as to provide a second continuous signal path between the first tier and the second tier that replicates the first continuous signal path

FIG. 6

MULTI-TIER MEMORY ARCHITECTURE

RELATED APPLICATIONS

This application claims priority to and the benefit of Provisional Patent Application No. 63/127,586, entitled "Multi-Layer Voltage Regulation Architecture," filed Dec. 18, 2020, which is hereby incorporated by reference in its entirety.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional circuit designs, process skew between multiple stacked dies in a layered chip typically needs a large guard-band for vertically folded data. Also, process skew can be removed by expensive binning based on testing process corners of each die in the stack, and then stacking only matching dies. Such a matching process can increase cost and also may not be feasible for wafer-to-wafer bonding, where chips are diced only after the connections have been made. Also, in a vertically stacked die, the different layers may have different temperatures, leading to further variation between the multiple layers, and thus, such variations cannot be fixed by binning. As such, there exists a need to improve efficiency of assessing process skew and/or assessing temperature skew in vertically stacked dies in some modern circuit designs and related applications.

BRIEF DESCRIPTION OF THE DRAWINGS

Implementations of various schemes and techniques are described herein with reference to the accompanying drawings. It should be understood, however, that the accompanying drawings illustrate only various implementations described herein and are not meant to limit embodiments of various techniques described herein.

FIG. 6 illustrates a diagram of a method for providing memory architecture in a multi-tier configuration in accordance with implementations described herein.

DETAILED DESCRIPTION

Various implementations described herein are directed to 3D multi-tier architecture schemes and techniques for logic and memory applications in physical design. For instance, various schemes and techniques described herein may provide for enhanced per-tier voltage regulation in 3D multi-tier memory architecture so as to manage process and/or temperature variation between multiple tiers. Also, the various schemes and techniques described herein may be configured to provide for 3D on-chip circuitry with per-tier voltage regulation so as to manage process and/or temperature variation between multiple tiers.

Various implementations described herein refer to multi-layer voltage regulation schemes and techniques for managing process and/or temperature variation in physical layout design applications. For instance, various implementations described herein relate to three-dimensional (3D) stacked die configurations with per-layer voltage regulation that may be configured to offset voltage regulator outputs on each respective layer to balance process skew and variations due to temperature differences between the layers.

In some implementations, process skew between dies stacked in a 3D chip may use a guard band for any data path folded in 3D. This process skew may be removed by expensive binning based on testing process corners of each die and then by stacking only matching dies. Such a matching process may increase cost and may not be feasible for wafer-to-wafer bonding, where chips are only diced after connections are made. Also, in 3D stacked systems, different layers may have different temperatures, leading to further variation between the layers, and such variations may not be fixed by binning. Also, clock-tree balancing may be an issue during design, and process skew between layers may be large, which may further compound the need for using a guard band, and as such, these issues typically result in loss of performance.

In some implementations, to overcome issues caused by process variation, the various implementations described herein utilize localized voltage regulators (VReg) per-layer in a multi-layer structure. For instance, process skew and variation due to difference in temperature on multiple layers may be balanced by using a small offset ($\Delta V$) to voltage supply to match variances in the layers. In various instances, $\Delta V$ may be small enough and may not need any level shifting between relatively similar voltage domains. By using proposed per-layer VReg, the mean distribution between layers may be matched, and in some cases, the mean distribution may not match exactly, but any variation may be made similar or less than the 2D guard band for similar technology.

Various implementations of providing various multi-tier memory architecture will be described herein with reference to FIGS. 1-6.

Figure 1:
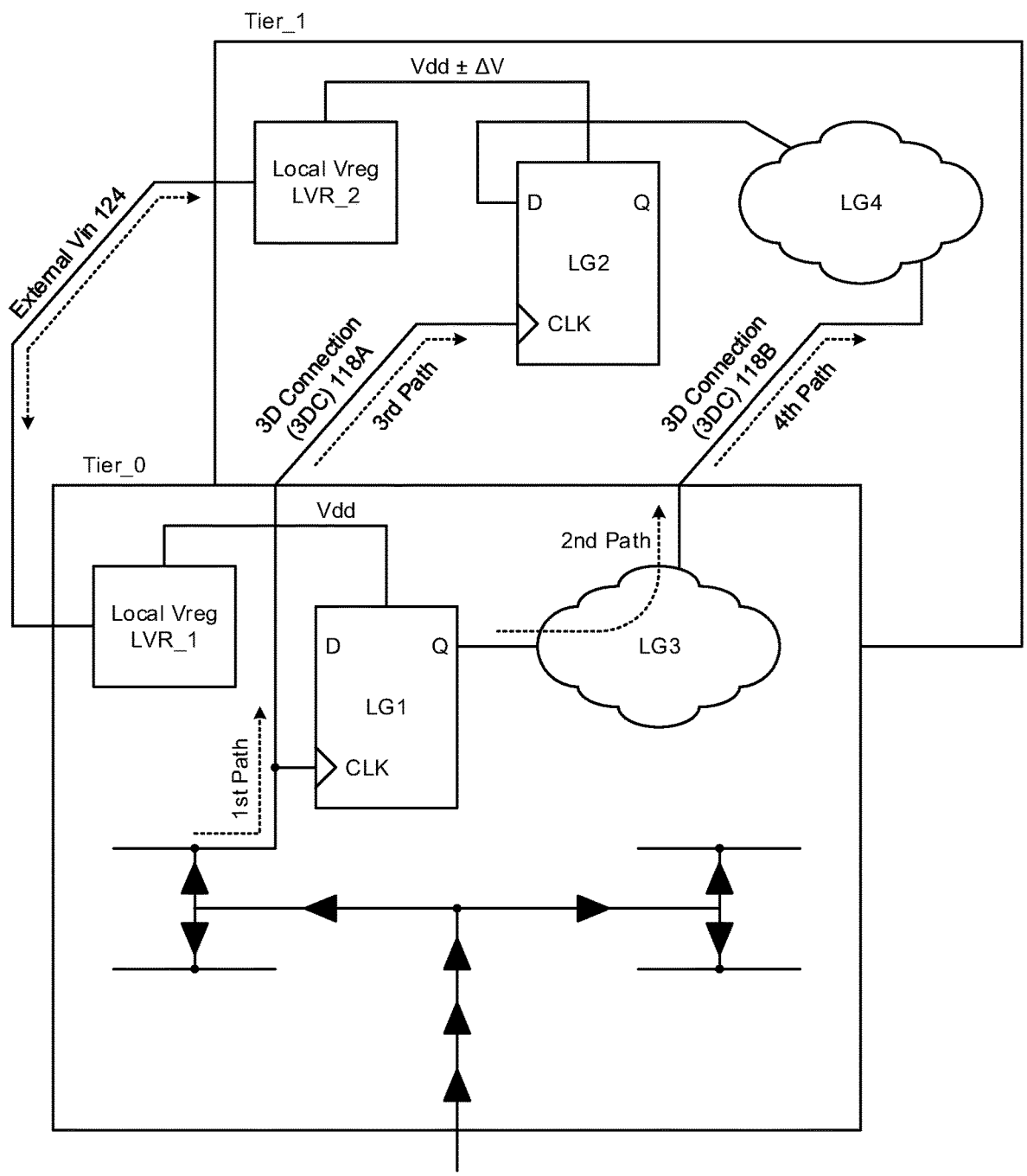
FIG. 1 illustrates a diagram of three-dimensional (3D) architecture with per-layer voltage regulation in accordance with various implementations described herein.

FIG. 1 illustrates a diagram 100 of three-dimensional (3D) architecture 104 with per-layer voltage regulation configuration in accordance with various implementations described herein.

In various implementations, the 3D architecture 104 may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing the 3D architecture 104 as an integrated system or device may involve use of various IC circuit components described herein so as to implement various fabrication schemes and techniques associated therewith. Moreover, the 3D architecture 104 may be integrated with computing circuitry and various related components on a single chip, and the 3D architecture 104 may be implemented and incorporated in various embedded systems for automotive, electronic, mobile, server and Internet-of-things (IoT) applications, including remote sensor nodes.

As shown in FIG. 1, the 3D architecture 104 may refer to three-dimensional (3D) architecture in a multi-tier configuration. For instance, the 3D architecture 104 may include multiple tiers including a first tier (Tier_0) and a second tier (Tier_1) that are arranged in a 3D stacked structure. In some instances, the first tier (Tier_0) may include first circuitry with a first signal path (1st path) and a second signal path (2nd path), and the second tier (Tier_2) may include second circuitry with a third signal path (3rd path) and a fourth signal path (4th path). The first signal path (1st path) may be coupled to the third signal path (3rd path) so as to provide a first continuous signal path 118A between the first tier (Tier_0) and the second tier (Tier_1). Also, the second signal path (2nd path) may be coupled to the fourth signal path (4th path) so as to provide a second continuous signal path 118B between the first tier (Tier_0) and the second tier (Tier_1) that replicates the first continuous signal path 118A. In some instances, the first continuous signal path 118A may be referred to as a first 3D connection (3DC) 118A, and the second continuous signal path 118B may be referred to as a second 3D connection (3DC) 118B.

In various implementations, the 3D architecture 104 may be configured to provide a multi-tiered 3D architecture that refers to a three-dimensional (3D) stacked die with per-tier voltage regulation (VR) so as to thereby manage process variation between the multiple tiers (Tier_0, Tier_1) of the multi-tiered 3D architecture 104. Also, in some instances, the 3D stacked die may have an asynchronous 3D boundary, which is described in greater detail herein below in reference to FIG. 5.

In various implementations, the 3D architecture 104 may include per-tier voltage regulation (VR) circuitry such that each tier has a local voltage regulation (Local Vreg) circuitry. For instance, as shown in FIG. 1, the first circuitry disposed in the first tier (Tier_0) may include first voltage regulation circuitry (LVR_1), and the second circuitry disposed in the second tier (Tier_1) may include second voltage regulation circuitry (LVR_2) that is coupled to the first voltage regulation circuitry (LVR_1) by way an inter-tier external Vin connection 124. Also, in various instances, process variation between the first tier (Tier_0) and the second tier (Tier_1) may be managed by the first voltage regulation circuitry (LVR_1) and the second voltage regulation circuitry (LVR_2).

In various implementations, the first voltage regulation circuitry disposed in the first tier (Tier_0) may be coupled to the second voltage regulation circuitry disposed in the second tier (Tier_1) by way of conductive lines so as to provide per-tier voltage regulation (VR) for managing process and/or temperature variation between the first tier (Tier_0) and the second tier (Tier_1). Also, in various implementations, the first voltage regulation circuitry and the second voltage regulation circuitry operate to balance process variation and/or skew due to differences in temperature in the first tier (Tier_0) and the second tier (Tier_1) by using a voltage offset ($\Delta V$) applied to an external voltage supply (External Vin) 124 so as to thereby provide matching voltages in the first tier (Tier_0) and the second tier (Tier_1).

In reference to the first tier (Tier_0), the local Vreg (LVR_1) may be coupled to at least one logic device (e.g., LG1), such as, e.g., sequential logic, so as to provide a voltage supply (Vdd) to the logic device (LG1). Also, the logic device (LG1) may have a clock input (CLK) that receives a clock signal via the first signal path (1st path), and the logic device (LG1) may be configured to provide an internal signal via output (Q) to other logic circuitry (e.g., LG3) by way of the second signal path (2nd path). The logic device (LG3) may refer to combinational logic. In some instances, as shown in FIG. 1, the first signal path (1st path) may pass from the first tier (Tier_0) to the second tier (Tier_1) by way of the first 3D connection (3DC) 118A. Also, as shown in FIG. 1, the second signal path (2nd path) may pass through the logic circuitry (LG3) from the first tier (Tier_0) to the second tier (Tier_1) by way of the second 3D connection (3DC) 118B.

In reference to the second tier (Tier_1), the local Vreg (LVR_2) may be coupled to at least one logic device (e.g., LG2), such as, e.g., sequential logic, so as to provide a regulated (or adjusted) voltage supply (Vdd±$\Delta V$) to the logic device (LG2). Also, the logic device (LG2) may include a clock input (CLK) that may receive the clock signal via the third signal path (3rd path) by way of the 3D connection (3DC) 118A from the first signal path (1st path). Also, the logic device (LG2) may be configured to receive an internal data signal via an input (D) from other logic circuitry (e.g., LG4) by way of the 4th signal path (4th path). The logic device (LG4) may refer to combinational logic. Moreover, the first local Vreg (LVR_1) disposed in the first tier (Tier_0) may be coupled to the second local Vreg (LVR_2) disposed in the second tier (Tier_1) by way of the conductive line.

In some implementations, per-tier voltage regulation (VR) may be used to manage process variation and/or temperature variation between the first tier (Tier_0) and the second tier (Tier_1). Also, the first local Vreg (LVR_1) and the second local Vreg (LVR_2) may be configured to balance process variation and/or skew due to differences in temperature in the first tier (Tier_0) and the second tier (Tier_1) by using the voltage offset ($\Delta V$) applied to an external voltage supply (External Vin) 124 so as to thereby provide matching voltages in the first tier (Tier_0) and the second tier (Tier_1). These and various other aspects, features and characteristics are described in greater detail herein below.

Figure 2A:
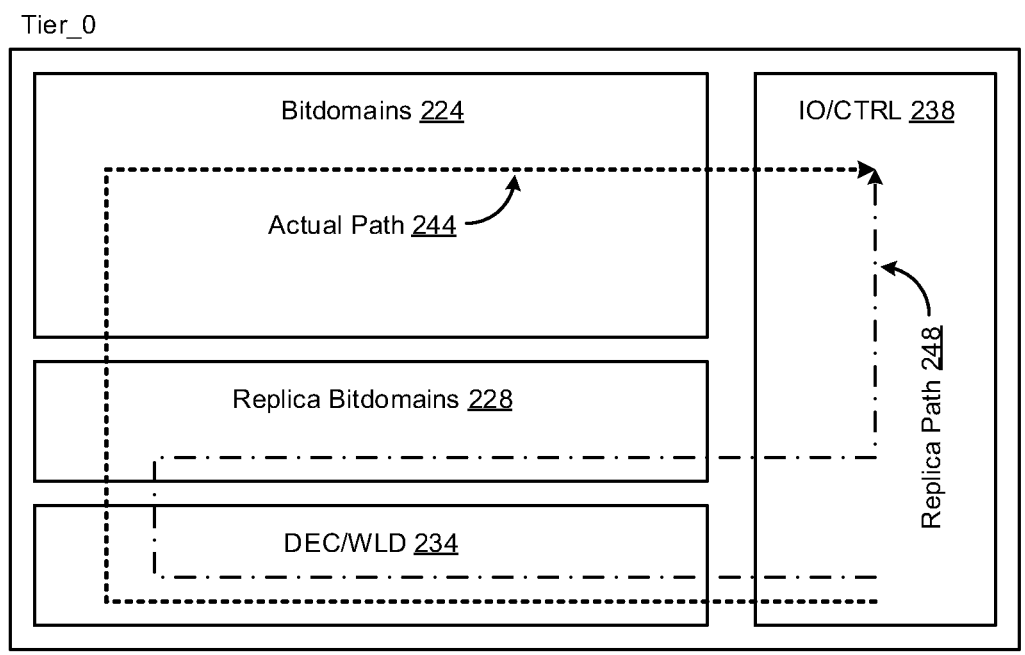
FIGS. 2A-2B illustrate diagrams of memory architecture in single and multi-tier configurations in accordance with various implementations described herein.
Figure 2B:
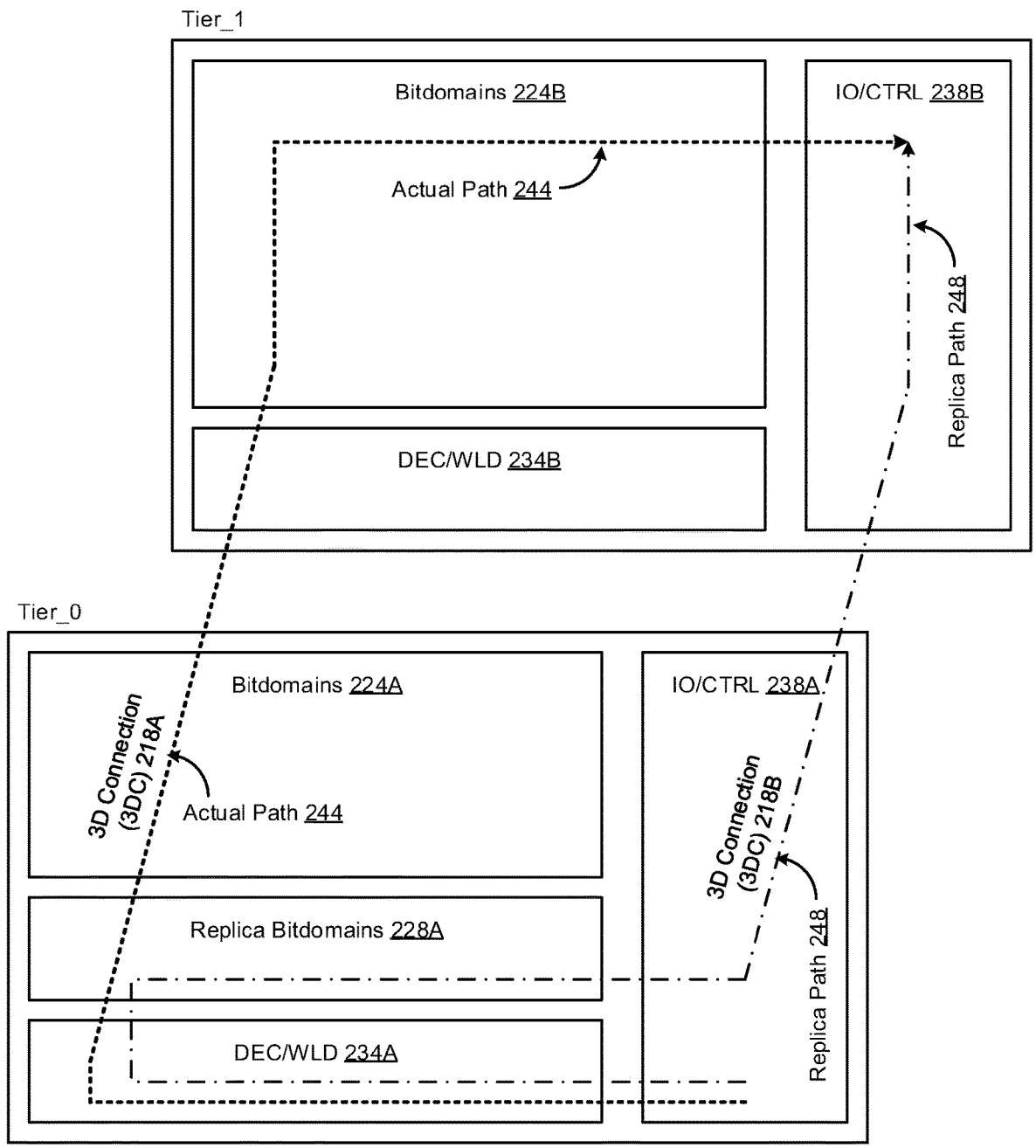

FIGS. 2A-2B illustrate diagrams of memory architecture in single and multi-tier configurations in accordance with implementations described herein. In particular, FIG. 2A shows a two-dimensional (2D) memory architecture 204A with a single-tier configuration, and FIG. 2B shows a 3D memory architecture 204B with a multi-tier configuration.

In various implementations, each of the memory architectures 204A, 204B may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing the memory architectures 204A, 204B as an integrated system or device may involve use of IC circuit components described herein so as to implement fabrication schemes and techniques associated therewith. Moreover, the memory architectures 204A, 204B may be integrated with computing circuitry and/or various related components on a single chip, and also, the memory architectures 204A, 204B may be implemented and incorporated in various embedded systems for automotive, electronic, mobile, server and Internet-of-things (IoT) applications, including remote sensor nodes.

As shown in FIG. 2A, the memory architecture 204A may refer to a 2D memory architecture in a single-tier configuration. The memory architecture 204A may have a single tier including a first tier (Tier_0) having first circuitry with a first signal path (actual path) 244 and a second signal path (replica path) 248. The first circuitry may include one or more logic circuits, such as, e.g., bitcells 224, replica bitcells 228, decoder and wordline driver 234, and input-output (10) and control 238, that are coupled together and configured to provide various memory functionality. In some instances, the first signal path (actual path) 244 may refer to a first continuous signal path that passes through the logic circuits 224, 228, 234, 238. Also, the second signal path (replica path) 248 may refer to a second continuous signal path that passes through the logic circuits 228, 234, 238. In various instances, the second signal path (replica path) 248 may be routed differently than the first signal path (actual path) 244.

As shown in FIG. 2B, the memory architecture 204B may refer to a 3D memory architecture in a multi-tier configuration. The memory architecture 204B may include multiple tiers including a first tier (Tier_0) and a second tier (Tier_1). The first tier (Tier_0) may include first circuitry with various logic circuits 224A, 228A, 234A, 238A, and the second tier (Tier_1) may include second circuitry with various logic circuits 224B, 234B, 238B. In some instances, the multi-tier configuration may provide first signal path (actual path) 244 as a first continuous signal path that is coupled between the first tier (Tier_0) and the second tier (Tier_1) by way of 3DC 218A. Also, the multi-tier configuration may provide second signal path (replica path) 248 as a second continuous signal path that is coupled between the first tier (Tier_0) and the second tier (Tier_1) by way of 3DC 218B. In various instances, the first continuous path may be separated into multiple parts that are coupled together by way of 3DC 218A with a first part disposed in the first tier (Tier_0) and a second part disposed in the second tier (Tier_1). Also, in various instances, the second continuous path may be separated into multiple parts that are coupled together by way of 3DC 218B with a first part disposed in the first tier (Tier_0) and a second part disposed in the second tier (Tier_1).

The first circuitry may include the logic circuits, such as, e.g., bitcells 224A, replica bitcells 228A, decoder and wordline driver 234A, and 10 and control 238A, that are coupled together and configured to provide various memory functionality in the first tier (Tier_0). Also, the second circuitry may include the logic circuits, such as, e.g., bitcells 224B, decoder and wordline driver 234B, and 10 and control 238B, that are coupled together and configured to provide various memory functionality in the second tier (Tier_1). As shown in FIG. 2B, the first signal path (actual path) 244 may provide the first continuous signal path that passes through the logic circuits 238A, 234A in the first tier (Tier_0) and the logic circuits 224B, 238B in the second tier (Tier_1). Also, as shown in FIG. 2B, the second signal path (replica path) 248 may provide a second continuous signal path that passes through the logic circuits 238A, 228A in the first tier (Tier_0) and the logic circuits 238B in the second tier (Tier_1). In various instances, the second signal path (replica path) 248 may be routed differently through the tiers (Tier_0, Tier_1) than the first signal path (actual path) 244.

Figure 3:
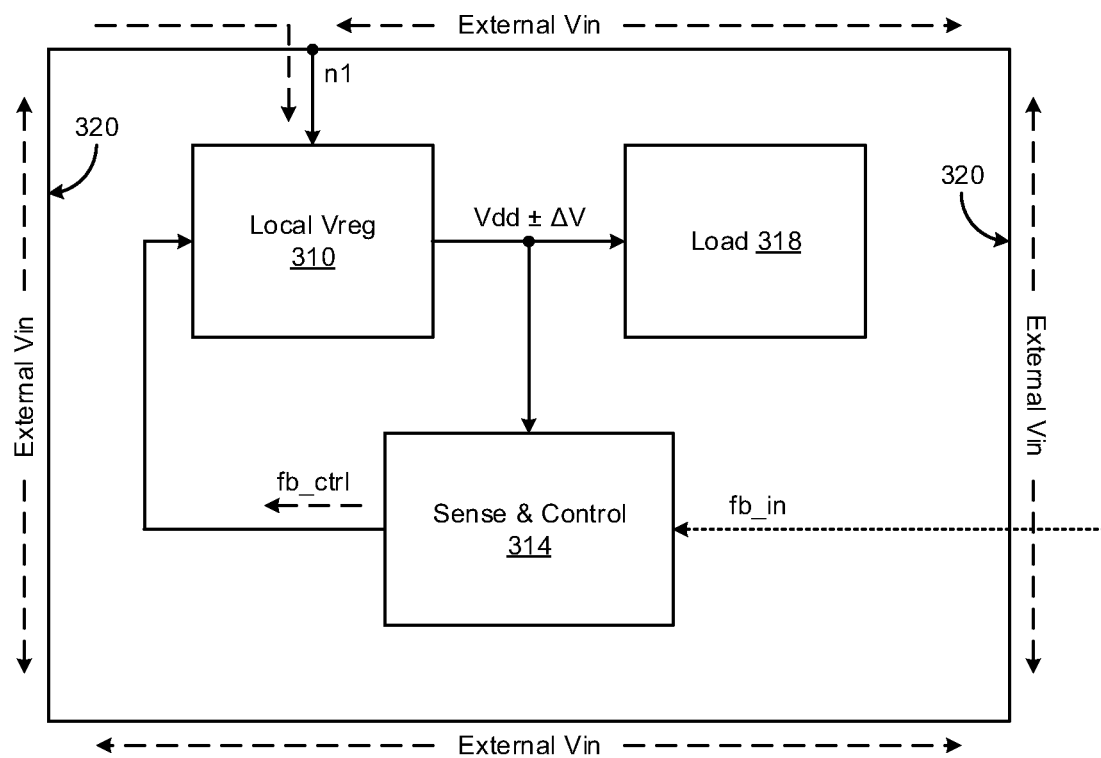
FIG. 3 illustrates a diagram of a single-domain power delivery network in accordance with various implementations described herein.

FIG. 3 illustrates a diagram 300 of a single-domain power delivery network (PDN) 304 in accordance with various implementations described herein.

In various implementations, the single-domain PDN 304 may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing the single-domain PDN 304 as an integrated system or device may involve use of various IC circuit components described herein so as to implement various IC fabrication schemes and techniques associated therewith. Moreover, the single-domain PDN 304 may be integrated with computing circuitry and various related components on a single chip, and the single-domain PDN 304 may be implemented and incorporated in various embedded systems for automotive, electronic, mobile, server and Internet-of-things (IoT) applications, including remote sensor nodes.

As shown in FIG. 3, the single-domain PDN 304 may refer to a single-layer voltage regulation (VR) architecture having a single-layer structure with a single layer, wherein the single layer may refer to a single tier. The single-layer VR architecture may include various circuitry, such as, e.g., a local voltage regulator circuit (Vreg) 310, a sense and control circuit 314, and a load 318, that are coupled together and configured to provide voltage regulation in the single tier. The single-layer VR architecture may also include a conductive boundary line 320 that provides an external input voltage (External Vin) to the local Vreg 310 by way of an input node (n1). Thus, in some instances, the external Vin is supplied to the local Vreg 314, which is configured to provide a regulated (or adjusted) voltage supply (Vdd±ΔV) to the load 318. Also, in some instances, as shown in FIG. 3, the local Vreg 310 receives the external Vin at node (n1), receives a feedback control voltage (fb_ctrl) from the sense and control circuit 314, and provide the regulated (or adjusted) voltage supply (Vdd±ΔV) to the load 318. Also, the sense and control circuit 314 receives the regulated (or adjusted) voltage supply (Vdd±ΔV) from the local Vreg 310, receives a feedback input voltage (fb_in) from an external source, and provides feedback control voltage (fb_ctrl) to the local Vreg 310. Also, in various instances, the local Vreg 310 may use the process sensor 314 to sense regulated output voltage (Vdd±ΔV) from the local Vreg 310, wherein the process sensor 314 provides feedback control (fb_ctrl) to the local Vreg 310 so as to track, manage and/or compensate localized process variations and/or skew in the single layer.

In some implementations, the local Vreg 310 is configured to manage temperature variation in the single layer of the single-domain PDN 304, and also, the local Vreg 310 may be configured to offset the voltage regulator output (Vdd±ΔV) supplied to the load 318 based on the feedback control voltage (fb_ctrl) so as to balance process variation and/or skew due to temperature differences in the single layer. Thus, in various instances, the local Vreg 310 is configured to balance process variation and/or skew due to differences in temperature on the single layer by using the voltage offset (ΔV) that is applied to the external voltage supply (External Vin). In various instances, the conductive boundary line 320 may be configured to provide the external voltage supply (External Vin) by way of an external source.

In various implementations, as shown in FIG. 3, the single-domain PDN 304 may be implemented with voltage regulation (VR) architecture having the localized voltage regulator (Local Vreg) 310 and the sense and control circuit 314 coupled to the load 318. Also, power is supplied to the localized voltage regulator (Local Vreg) 310 as external voltage supply (Vin) from an external power source, which is provided as input to local Vreg 310. So as to avoid IR drops on the external Vin supply before reaching the local Vreg 310, a power grid 320 may be used to connect the external Vin supply to the local Vreg 310. In some instances, the power grid 320 may refer to conductive boundary lines arranged as a mesh.

In some implementations, the power grid 320 may be tapped (e.g., at node n1) by the local Vreg 310, and thus, the power grid 320 supplies the load (or load circuits) 118 with a local power grid voltage (e.g., Vdd). Also, the local Vreg 310 may be configured to provide a local regulator output voltage (Vdd±ΔV) that is sensed by the process sensor 314, which provides feedback control (fb_ctrl) to the local Vreg 310. In some instances, the local Vreg 310 may be configured to track, manage and/or compensate localized process skew and variation, which may lead to tighter distribution and hence improved performance.

In some implementations, the process sensor and controller 314 may have logic circuitry, such as, e.g., various different mixes of logic gates (e.g., Inverters, NAND gates, NOR gates, and/or various exotic circuitry for n-only and p-only device matching). Further, in some instances, closed loop control with local Vreg 310 may be configured to reduce mean square error from an average count of the logic circuitry so as to balance the single-domain layer. Otherwise, a reference count may be used, in which case, some other sensor output may communicate with the sensor and controller 314 from external circuitry.

In some implementations, the process sensor and controller 314 may receive one or more external signals from various other circuitry. For instance, the process sensor and controller 314 may receive an optional feedback input signal (e.g., fb_in, or similar) from other layers (or other circuitry) as process sensor output from one or more adjacent layers (or adjacent logic circuitry) for fb_in sense and/or control. Thus, in some instances, the process voltage fb_in may be received by the process sensor and controller 314 as sensor output from an adjacent (or neighboring) local Vreg in an adjacent layer (e.g., one or more layers above and/or below) and/or in adjacent (or neighboring) local Vreg circuitry for fb_in sense and/or control. Thus, in this instance, the process sensor and controller 314 may acquire feedback from the sensor output (fb_in) of adjacent layers, or other local Vreg circuitry, or from a centralized controller used by one or more or all process sensors, or independently converge from an external output to generate the feedback control signal (fb_ctrl).

Figure 4:
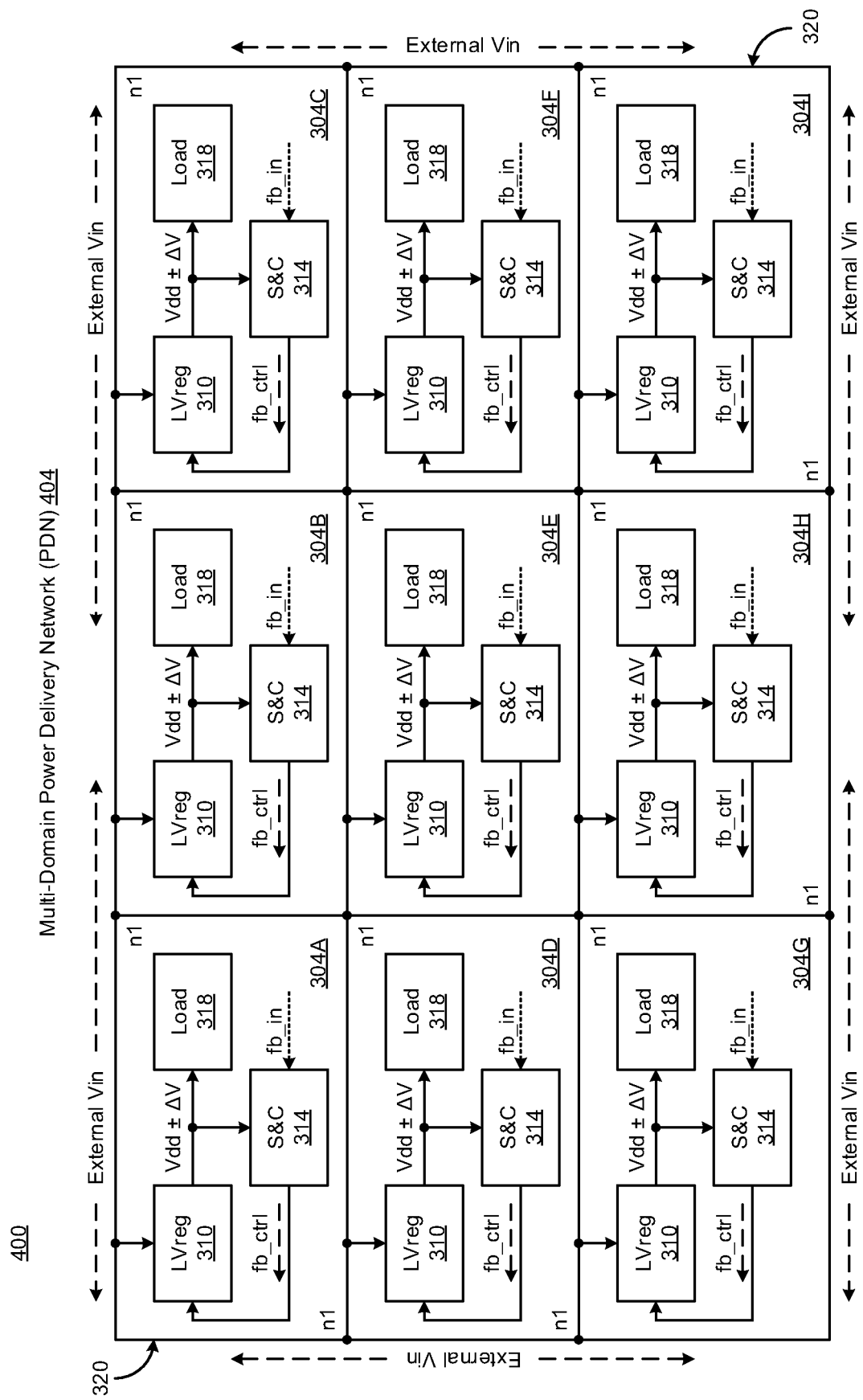
FIG. 4 illustrates a diagram of a multi-domain power delivery network in accordance with various implementations described herein.

FIG. 4 illustrates a diagram 400 of a multi-domain power delivery network (PDN) 404 in accordance with various implementations described herein. In reference to FIG. 4, the multi-domain PDN 404 may have similar features, components and characteristics as the single-domain PDN 304 shown in FIG. 3.

In various implementations, the multi-domain PDN 404 may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing the multi-domain PDN 404 as an integrated system or device may involve use of various IC circuit components described herein so as to implement various fabrication schemes and techniques associated therewith. Moreover, the multi-domain PDN 404 may be integrated with computing circuitry and various related components on a single chip, and also, the multi-domain PDN 404 may be implemented and incorporated in various embedded systems for automotive, electronic, mobile, server and/or Internet-of-things (IoT) applications, including remote sensor nodes.

As shown in FIG. 4, the multi-domain PDN 404 may refer to a single-layer voltage regulation (VR) architecture having a single-layer structure with a single layer and an array of multiple single-domain PDNs (304A, 304B, . . . , 304I), wherein the single layer may refer to a single tier. Also, each single-domain PDN (304A, 304B, . . . , 304I) may include various circuitry, such as, e.g., the local voltage regulator circuit (Vreg) 310, the sense and control circuit 314, and the load 318, that are coupled together and configured to provide voltage regulation (VR) in the single tier. The single-layer VR architecture may also include the conductive boundary line 320 that provides the external input voltage (External Vin) to each local Vreg 310 by way of the input nodes (n1). Thus, in various instances, the external Vin is supplied to each local Vreg 314, which is configured to provide a regulated (or adjusted) voltage supply (Vdd±ΔV) to the load 318 in each single-domain PDN (304A, 304B, . . . , 304I). Also, in various instances, as shown in FIG. 4, each local Vreg 310 receives the external Vin at node (n1), receives a feedback control voltage (fb_ctrl) from the sense and control circuit 314, and also provides the regulated (or adjusted) voltage supply (Vdd±ΔV) to the load 318. Also, the sense and control circuit 314 receives the regulated (or adjusted) voltage supply (Vdd±ΔV) from the local Vreg 310, receives feedback input voltage (fb_in) from an external source, and provides the feedback control voltage (fb_ctrl) to the local Vreg 310.

In various implementations, each local Vreg 310 in each single-domain PDN (304A, 304B, . . . , 304I) may be configured to manage temperature variation in the single layer of the multi-domain PDN 404, and also, each local Vreg 310 may be configured to offset the voltage regulator output (Vdd±ΔV) supplied to the load 318 based on the feedback control voltage (fb_ctrl) so as to balance process variation and/or skew due to temperature differences in the single layer. Thus, in various instances, each local Vreg 310 is configured to balance process variation and/or skew due to differences in temperature on the single layer, e.g., by using the voltage offset (ΔV) that is applied to the external voltage supply (External Vin). In various instances, the conductive boundary line 320 may be configured to provide the external Vin to each single-domain PDN (304A, 304B, . . . , 304I) by way of an external source.

In various implementations, as shown in FIG. 4, the multi-domain PDN 404 may be implemented with voltage regulation architecture having multiple localized voltage regulators (LVreg) 310 arranged in a grid pattern (e.g., array, or similar) along with multiple sense and control circuits (S&C) 314 coupled to respective localized loads (or load circuits) 318. In some instances, power is supplied to the localized voltage regulators (Local Vreg) 310 as external voltage supply (Vin) from an external power source, which is provided as input to each local Vreg 310. So as to avoid IR drops on the external Vin supply before reaching the local Vreg 310, the power grid 320 may be used to connect the external Vin supply to the local Vregs 310. In some instances, the power grid 320 may refer to multiple conductive boundary lines arranged in grid pattern, e.g., as a power mesh, or similar.

In some implementations, the power grid 320 may be tapped (e.g., at various nodes n1) by the local Vregs 310, and thus, the power grid 320 supplies the loads (or load circuits) 318 with the local power grid voltage (e.g., Vdd). Also, each local Vreg 310 may be configured to provide local regulator output voltage (Vdd±ΔV) that is sensed by each process sensor 314, which provides feedback control (fb_ctrl) to each local Vreg 310. In some instances, each local Vreg 310 may be configured to track, manage and/or compensate localized process skew and variation, which may lead to tighter distribution and improved performance.

Figure 5:
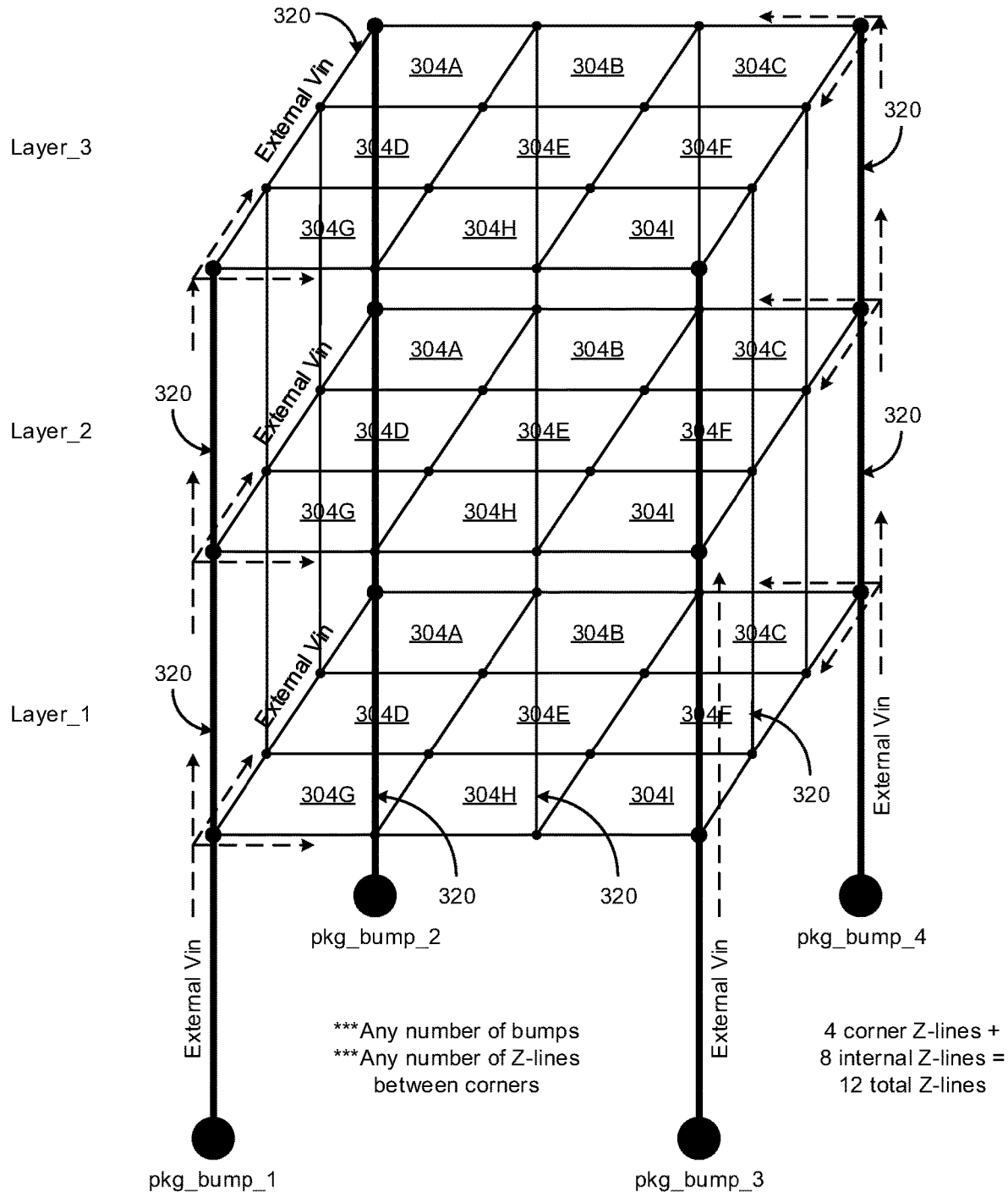
FIG. 5 illustrates a diagram of a three-dimensional (3D) multi-domain power delivery network in accordance with various implementations described herein.

FIG. 5 illustrates a diagram 500 of a 3D multi-domain power delivery network (PDN) 504 in accordance with various implementations described herein. In reference to FIG. 5, the 3D multi-domain PDN 504 may have similar features, components and characteristics as the single-domain PDN 304 shown in FIG. 3 and the multi-domain PDN 404 in FIG. 4.

In various implementations, the 3D multi-domain PDN 504 may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing the 3D multi-domain PDN 504 as an integrated system or device may involve use of various IC circuits and components described herein so as to implement various fabrication schemes and techniques associated therewith. Moreover, the 3D multi-domain PDN 504 may be integrated with computing circuitry and various related components on a single chip, and also, the 3D multi-domain PDN 504 may be implemented and/or incorporated in various embedded systems for automotive, electronic, mobile, server and/or Internet-of-things (IoT) applications, including remote sensor nodes.

As shown in FIG. 5, the 3D multi-domain PDN 504 may refer to a multi-layer voltage regulation (VR) architecture having a multi-layer structure with multiple layers and with one or more layers having an array of multiple single-domain PDNs (304A, 304B, . . . , 304I), wherein the multi-layer architecture may refer to a multi-tier architecture. Also, each single-domain PDN (304A, 304B, . . . , 304I) in one or more layers may include various circuitry, such as, e.g., the local Vreg 310, the sense and control circuit 314, and the load 318, that are coupled together and configured to provide voltage regulation (VR) in one or more layers or tiers. The multi-layer VR architecture may also include 3D conductive boundary lines 320 (in xyz directions) that provide the external input voltage (External Vin) to each local Vreg 310 in one or more layers by way of nodes (n1). Thus, in various instances, the external Vin is supplied to each local Vreg 314 in one or more layers, which is configured to provide a regulated (or adjusted) voltage supply (Vdd±ΔV) to the load 318 in each single-domain PDN (304A, 304B, . . . , 304I). Also, as described herein, each local Vreg 310 in one or more layers receives the external Vin at node (n1), receives a feedback control voltage (fb_ctrl) from the sense and control circuit 314, and also provides the regulated (or adjusted) voltage supply (Vdd±ΔV) to the load 318. Also, as described herein, the sense and control circuit 314 receives the regulated (or adjusted) voltage supply (Vdd±ΔV) from the local Vreg 310, receives feedback input voltage (fb_in) from an external source, and also provides the feedback control voltage (fb_ctrl) to the local Vreg 310.

In various implementations, the 3D voltage regulation architecture may refer to a multi-layer structure with multiple layers (Layer_1, Layer_2, Layer_3), wherein one or more layers of the multiple layers (Layer_1, Layer_2, Layer_3) has voltage regulation circuitry (LVreg 310) that is configured to manage process variation between each of the multiple layers (Layer_1, Layer_2, Layer_3) of the multi-layer structure. As shown in FIG. 5, the multi-layer structure may refer to a three-dimensional (3D) stacked die with per layer voltage regulation to manage process variation between the multiple layers (Layer_1, Layer_2, Layer_3) of the multi-layer structure, and also, the 3D stacked die may have an asynchronous 3D boundary. Also, the multi-layer structure may include any number of layers, such as, e.g., a first layer (Layer_1), a second layer (Layer_2) and a third layer (Layer_3), wherein one or more layers may have an array of multiple single-domain PDNs (304A, 304B, . . . , 304I). In some instances, as shown in FIG. 5, the corner 3D conductive lines 320 may be larger than the other 3D conductive lines 320 disposed between and within the layers (Layer_1, Layer_2, Layer_3).

In various implementations, each local Vreg 310 in each single-domain PDN (304A, 304B, . . . , 304I) may be configured to manage temperature variation within one or more layers of the multiple layers (Layer_1, Layer_2, Layer_3) of the 3D multi-domain PDN 504. Also, each local Vreg 310 may be configured to offset the voltage regulator output (Vdd±ΔV) supplied to the load 318 based on the feedback control voltage (fb_ctrl) so as to balance process variation and/or skew due to temperature differences in the single layer. Thus, in various instances, each local Vreg 310 is configured to balance process variation and/or skew due to differences in temperature on one or more layers of the multiple layers (Layer_1, Layer_2, Layer_3) by using the voltage offset (ΔV) that is applied to the external voltage supply (External Vin). In various instances, the conductive boundary lines 320 may be configured to provide the external Vin to one or more layers of the multiple layers (Layer_1, Layer_2, Layer_3) by way of an external source supplied to the 3D multi-domain PDN 504 via one or more conductive package bonds, such as, e.g., package bumps (pkg_bump_1, pkg_bump_2, pkg_bump_3, pkg_bump_4).

In some implementations, the voltage regulation circuitry (e.g., LVreg 310) may be configured to manage temperature variation between the multiple layers (Layer_1, Layer_2, Layer_3) of the multi-layer structure. Also, the voltage regulation circuitry (e.g., LVreg 310) of one or more layers (Layer_1, Layer_2, Layer_3) may offset voltage regulator outputs for one or more layers so as to balance process variation and/or skew due to temperature differences between the multiple layers (Layer_1, Layer_2, Layer_3). Also, in some instances, the voltage regulation circuitry (e.g., LVreg 310) of one or more layers may include one or more voltage regulators that are interconnected by way of conductive boundary lines 320, and also, the one or more voltage regulators of one or more layers may be configured to provide per layer voltage regulation to manage process variation between the multiple layers (Layer_1, Layer_2, Layer_3) of the multi-layer structure. Moreover, the one or more voltage regulators of one or more layers may be configured to balance process variation and/or skew due to differences in temperature in the multiple layers (Layer_1, Layer_2, Layer_3) by using the voltage offset (ΔV) that is applied to the external voltage supply (External Vin) by way of the conductive boundary lines 320 so as to thereby provide matching voltages in the multiple layers (Layer_1, Layer_2, Layer_3).

In some implementations, the conductive lines 320 may be configured to provide the external voltage supply (External Vin) by way of an external source, and also, the external source may refer to conductive package bonds, such as, e.g., connections, probes, pins or bumps. For instance, as shown in FIG. 5, the conductive package bonds may refer to one or more package bumps (pkg_bump_1, pkg_bump_2, pkg_bump_3, pkg_bump_4). Also, in various instances, voltage and/or power to the 3D multi-domain PDN 504 may be supplied from the external source as input to the voltage regulators (LVreg 310) in one or more layers (Layer_1, Layer_2, Layer_3). Also, a Z-dimension power grid may be configured to use the conductive boundary lines 320 to couple or connect the external voltage supply (External Vin) to one or more layers (Layer_1, Layer_2, Layer_3). Moreover, as described herein, each voltage regulator (LVreg 310) of one or more layers may have a process sensor (e.g., 314) that is configured to sense regulated output voltage from the voltage regulators (LVreg 310) and also provide feedback control (fb_ctrl) to the voltage regulators (LVreg 310) so as to thereby track, manage and/or compensate localized process variations and/or skew in one or more layers (Layer_1, Layer_2, Layer_3).

In some implementations, as shown in FIG. 5, the multi-layered, multi-domain power delivery network (PDN) 504 may be implemented with voltage regulation architecture having a multi-layered (e.g., mutely-tiered) structure with multiple layers (e.g., Layer_1, Layer_2, Layer_3). In various implementations, one or more layers (Layer_1, Layer_2, Layer_3) may include voltage regulation circuitry (304A, 304B, ..., 304I) that is configured to manage process variation between the multiple layers of the multi-layer structure. In some instances, the multi-layer structure may refer to a three-dimensional (3D) stacked die with per layer voltage regulation so as to manage process variation between the multiple layers of the multi-layer structure. Also, in addition to managing process variation, the voltage regulation circuitry (304A, 304B, ..., 304I) may be configured to manage temperature variation between the multiple layers of the multi-layer structure. Also, the voltage regulation circuitry (304A, 304B, ..., 304I) of one or more layers (Layer_1, Layer_2, Layer_3) may offset voltage regulator outputs for one or more layers (Layer_1, Layer_2, Layer_3) so as to balance process variation and/or skew due to temperature differences between the multiple layers.

In some instances, the voltage regulation circuitry (304A, 304B, ..., 304I) of one or more layers (Layer_1, Layer_2, Layer_3) may include one or more voltage regulators 310 that are interconnected by way of conductive boundary lines of the power grid 320. The voltage regulators 310 of one or more layers (Layer_1, Layer_2, Layer_3) may be configured to provide per layer voltage regulation to manage process variation between the multiple layers of the multi-layer structure. Also, the voltage regulators 310 of one or more layers (Layer_1, Layer_2, Layer_3) may be configured to balance process variation and/or skew due to differences in temperature on the multiple layers by using a voltage offset ($\Delta V$) applied to the external voltage supply (e.g., Vin regulated to Vdd) so as to provide matching voltages in the multiple layers. Also, the conductive boundary lines may be configured to provide the external voltage supply (Vin) by way of one or more conductive package bumps (pkg_bump_1, pkg_bump_2, pkg_bump_3, pkg_bump_4). Also, power may be supplied from conductive package bumps (pkg_bump_1, pkg_bump_2, pkg_bump_3, pkg_bump_4) as input to the voltage regulators 310 in each layer, and further, the power grid 320 may refer to a Z-dimension power grid that is configured to use the conductive boundary lines to connect the external voltage supply (Vin) to each layer. Also, the voltage regulators 310 of one or more layers may include the process sensor and controller 314 that is configured to sense regulated output voltage from the voltage regulators 310 and provide the feedback control (fb_ctrl) to the voltage regulators 310 so as to thereby track, manage and/or compensate localized process variations and skew in each layer.

In some implementations, as shown in FIG. 5, the power grid 320 may include extra vertical (or Z-dimensional) interconnections disposed alongside and/or between the multiple layers (Layer_1, Layer_2, Layer_3). For instance, the power grid 320 may have four corner-based vertical lines from the four package bumps along with eight additional side-based Z-routes in between the four corner-based vertical lines, which may be used to strengthen the Z-grid. In this instance, as shown in FIG. 5, there are two vertical lines disposed on each side of the power grid 320 between each corner-based vertical line of the power grid 320. Thus, in some instances, extra Z-grid lines between the layers and/or the corners may add significant strength to the Z-dimensional power grid 320.

FIG. 6 illustrates a diagram of a method 600 for providing memory architecture in a multi-tier configuration in accordance with implementations described herein.

It should be understood that even though method 600 indicates a particular order of operation execution, in some cases, various portions of operations may be executed in a different order, and on different systems. In other cases, additional operations and/or steps may be added to and/or omitted from method 600. Also, method 600 may be implemented in hardware and/or software. For instance, if implemented in hardware, method 600 may be implemented with various components and/or circuitry, as described in FIGS. 1-5. Also, in other instances, if implemented in software, method 600 may be implemented as a program or software instruction process configured for providing 3D multi-tier memory architecture, as described herein. Also, in other instances, if implemented in software, instructions related to implementing method 600 may be stored and/or recorded in memory and/or a database. As such, a computer or various other types of computing devices with a processor and memory may be configured to perform method 600.

As described in reference to FIG. 6, the method 600 may be used for fabricating and/or manufacturing, or causing to be fabricated and/or manufactured, an integrated circuit (IC) that implements various layout schemes and techniques in physical design as described herein so as to thereby provide multi-tier memory architecture with voltage regulation using various associated devices, components and/or circuitry as described herein.

At block 610, method 600 may provide a first tier having first memory circuitry with a first signal path and a second signal path. At block 620, method 600 may provide a second tier having second memory circuitry with a third signal path and a fourth signal path. Also, at block 630, method 600 may couple the first signal path to the third signal path so as to provide a first continuous signal path between the first tier and the second tier. Further, at block 640, method 600 may couple the second signal path to the fourth signal path so as to provide a second continuous signal path between the first tier and the second tier that replicates the first continuous signal path. In various implementations, the first tier and the second tier may be formed as a multi-tiered memory architecture that is configured as a three-dimensional (3D) stacked die with per-tier voltage regulation for managing process variation between the multiple tiers of the multi-tiered memory architecture. Moreover, in some instances, the 3D stacked die may have an asynchronous 3D boundary.

In some implementations, method 600 may provide the first memory circuitry with first voltage regulation circuitry, method 600 may provide the second memory circuitry with second voltage regulation circuitry that is coupled to the first voltage regulation circuitry. Also, method 600 may manage process variation between the first tier and the second tier by using the first voltage regulation circuitry and the second voltage regulation circuitry.

In various implementations, method 600 may couple the first voltage regulation circuitry to the second voltage regulation circuitry by way of conductive boundary lines so as to provide per-tier voltage regulation for managing the process variation between the first tier and the second tier. Also, method 600 may operate the first voltage regulation circuitry along with the second voltage regulation circuitry so as to balance process variation and skew due to differences in temperature in the first tier and the second tier by using a voltage offset (ΔV) that is applied to an external voltage supply so as to thereby provide matching voltages in the first tier and the second tier.

In various implementations, method 600 may couple the first voltage regulation circuitry to the second voltage regulation circuitry by way of conductive boundary lines so as to provide per-tier voltage regulation for managing the process variation between the first tier and the second tier. Also, method 600 may operate the first voltage regulation circuitry along with the second voltage regulation circuitry so as to balance process variation or skew due to differences in temperature in the first tier and the second tier by using a voltage offset (ΔV) that is applied to an external voltage supply so as to thereby provide matching voltages in the first tier and the second tier.

Various implementations described herein refer to multi-layer voltage regulation schemes and techniques for managing process and/or temperature variation in physical layout design applications. For instance, various implementations described herein relate to 3D power delivery network (PDN) architecture with a Z-dimension power grid to supply external Vin/Vdd uniformly to one or more or all localized voltage regulators. In various instances, one or more layers may have one or more local voltage regulators (LVreg), wherein each LVreg provides distributed voltage regulation on each layer, which supplies the load and/or load circuits on each layer. Also, the local regulator output voltage may be sensed by a process sensor and controller that provides feedback control to each LVreg.

Advantages to implementing the process variation schemes and techniques described herein may include one or more of the following. For instance, per-layer Vreg with voltage offsets (ΔV) may be used to counter process skew on multiple layers due to process and ambient temperature variations between the multiple layers. Also, in some instances, a Z-dimension power grid may be used to distribute external Vin/Vdd to each layer, and one or more layers may be powered-down separately, wherein intelligently partitioned designs may run with just one-tier or one-level in a low power mode. Moreover, in some instances, when using non-interacting units on multiple layers, independent DVFS may be run on the layers, and bulk voltage control may be used in planer and SOI technologies to independently control process mismatches of PMOS and NMOS devices.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include voltage regulation architecture having a multi-layer structure with multiple layers, wherein one or more layers of the multiple layers may have voltage regulation circuitry configured to manage at least one of process variation and temperature variation between the multiple layers of the multi-layer structure.

Described herein are various implementations of a device having multiple tiers including a first tier and a second tier. The first tier may include first circuitry with a first signal path and a second signal path, and the second tier may have second circuitry with a third signal path and a fourth signal path. The first signal path may be coupled to the third signal path so as to provide a first continuous signal path between the first tier and the second tier. The second signal path may be coupled to the fourth signal path so as to provide a second continuous signal path between the first tier and the second tier such that the second continuous signal path replicates the first continuous signal path.

Described herein are various implementations of a method. The method may couple first voltage regulation circuitry to second voltage regulation circuitry by way of conductive lines so as to provide per-tier voltage regulation for managing variation between a first tier and a second tier. The method may operate the first voltage regulation circuitry along with the second voltage regulation circuitry so as to balance process variation or skew due to differences in temperature in the first tier and the second tier by using different voltage offsets (ΔV) that are applied to an external voltage supply.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device comprising:
voltage regulation architecture having a multi-layer structure with multiple layers,
wherein the multi-layer structure has per layer voltage regulation circuitry that is configured to manage at least one of process variation and temperature variation between the multiple layers of the multi-layer structure.

2. A device comprising:
voltage regulation architecture having a multi-layer structure with multiple layers,
wherein one or more layers of the multiple layers has voltage regulation circuitry configured to manage at least one of process variation and temperature variation between the multiple layers of the multi-layer structure, and
wherein the multi-layer structure refers to a three-dimensional (3D) stacked die with per layer voltage regulation to manage process variation between the multiple layers of the multi-layer structure.

3. A device comprising:
voltage regulation architecture having a multi-layer structure with multiple layers,
wherein one or more layers of the multiple layers has voltage regulation circuitry configured to manage at least one of process variation and temperature variation between the multiple layers of the multi-layer structure,
wherein the voltage regulation circuitry is configured to manage temperature variation between the multiple layers of the multi-layer structure, and
wherein the voltage regulation circuitry of the one or more layers offset voltage regulator outputs for the one or more layers so as to balance process variation and skew due to temperature differences between the multiple layers.

4. A device comprising:
voltage regulation architecture having a multi-layer structure with multiple layers, \
wherein one or more layers of the multiple layers has voltage regulation circuitry configured to manage at least one of process variation and temperature variation between the multiple layers of the multi-layer structure,
wherein the voltage regulation circuitry of the one or more layers include one or more voltage regulators that are interconnected by way of conductive lines, and
wherein the one or more voltage regulators of the one or more layers are configured to provide per layer voltage regulation to manage variation between the multiple layers of the multi-layer structure.

5. The device of claim 4, wherein the one or more voltage regulators of the one or more layers are configured to balance process variation and skew due to differences in temperature on the multiple layers by using different voltage offsets ($\Delta V$) applied to an external voltage supply.

6. The device of claim 4, wherein the one or more voltage regulators of the one or more layers are configured to balance process variation or skew due to differences in temperature on the multiple layers by using different voltage offsets ($\Delta V$) applied to an external voltage supply.

7. The device of claim 4, wherein:
the conductive lines are configured to provide an external voltage supply by way of an external source,
the external source refers to conductive package bonds including connections, probes, pins or bumps, and
power is supplied from the external source as input to the one or more voltage regulators, and wherein a Z-dimension power grid is configured to use conductive lines to connect the external voltage supply to each layer.

8. The device of claim 4, wherein the one or more voltage regulators of the one or more layers have a process sensor that is configured to sense a regulated output voltage from the one or more voltage regulators and provide feedback control to the one or more voltage regulators so as to thereby track and compensate localized variations and skew in each layer.

9. A device comprising:
a first tier having first circuitry with a first signal path and a second signal path; and
a second tier having second circuitry with a third signal path and a fourth signal path,
wherein the first signal path is coupled to the third signal path so as to provide a first continuous signal path between the first tier and the second tier,
wherein the second signal path is coupled to the fourth signal path so as to provide a second continuous signal path between the first tier and the second tier such that the second continuous signal path replicates the first continuous signal path, and
wherein the first and second circuitry provide per-tier voltage regulation to manage process variation between the first and second tiers.

10. The device of claim 9, wherein:
the first circuitry has first voltage regulation circuitry, and
the second circuitry has second voltage regulation circuitry that is coupled to the first voltage regulation circuitry.

11. The device of claim 10, wherein:
variation and temperature between the first tier and the second tier are managed by the first voltage regulation circuitry and the second voltage regulation circuitry.

12. The device of claim 11, wherein:
the first voltage regulation circuitry is coupled to the second voltage regulation circuitry by way of conductive lines so as to provide per-tier voltage regulation for managing process variation between the first tier and the second tier.

13. The device of claim 12, wherein:
the first voltage regulation circuitry and the second voltage regulation circuitry operate to balance process variation and skew due to differences in temperature in the first tier and the second tier by using a voltage offset ($\Delta V$) applied to an external voltage supply.

14. The device of claim 12, wherein:
the first voltage regulation circuitry and the second voltage regulation circuitry operate to balance process variation or skew due to differences in temperature in the first tier and the second tier by using different voltage offsets ($\Delta V$) applied to an external voltage supply.

15. A device comprising:
a first tier having first circuitry with a first signal path and a second signal path; and
a second tier having second circuitry with a third signal path and a fourth signal path,
wherein the first signal path is coupled to the third signal path so as to provide a first continuous signal path between the first tier and the second tier,
wherein the second signal path is coupled to the fourth signal path so as to provide a second continuous signal path between the first tier and the second tier such that the second continuous signal path replicates the first continuous signal path, and
wherein the device provides a multi-tiered memory architecture that refers to a three-dimensional (3D) stacked die with per-tier voltage regulation to manage process variation between the multiple tiers of the multi-tiered memory architecture.

16. A method comprising:
coupling first voltage regulation circuitry to second voltage regulation circuitry by way of conductive lines so as to provide per-tier voltage regulation for managing variation between a first tier and a second tier, and
operating the first voltage regulation circuitry along with the second voltage regulation circuitry so as to balance at least one of process variation and skew due to differences in temperature in the first tier and the second tier by using different voltage offsets ($\Delta V$) that are applied to an external voltage supply.

17. The method of claim 16, further comprising:
providing the first tier with first memory circuitry having a first signal path and a second signal path; and
providing the second tier with second memory circuitry having a third signal path and a fourth signal path.

18. The method of claim 17, further comprising:
coupling the first signal path to the third signal path so as to provide a first continuous signal path between the first tier and the second tier; and
coupling the second signal path to the fourth signal path so as to provide a second continuous signal path between the first tier and the second tier that replicates the first continuous signal path.

19. The method of claim 18, wherein:
the first tier and the second tier are formed as a multi-tiered memory architecture that refers to a three-dimensional (3D) stacked die with per-tier voltage regulation for managing process variation between the multiple tiers of the multi-tiered memory architecture.

20. The method of claim 18, further comprising:
providing the first memory circuitry with first voltage regulation circuitry,
providing the second memory circuitry with second voltage regulation circuitry that is coupled to the first voltage regulation circuitry, and
managing process variation between the first tier and the second tier by using the first voltage regulation circuitry and the second voltage regulation circuitry.

* * * * *